(12) United States Patent
Genfan

(10) Patent No.: US 6,359,792 B1
(45) Date of Patent: Mar. 19, 2002

(54) COMPACT MICROWAVE STRUCTURE HAVING REDUCED RF LEAKAGE

(75) Inventor: German S. Genfan, Newton, MA (US)

(73) Assignee: Renaissance Electronics Corporation, Harvard, MA (US)

( * ) Notice: Subject to any disclaimer, the term of this patent is extended or adjusted under 35 U.S.C. 154(b) by 0 days.

(21) Appl. No.: 09/633,744

(22) Filed: Aug. 7, 2000

(51) Int. Cl.$^7$ ................................................. H05K 9/00
(52) U.S. Cl. ..................... 361/816; 361/752; 361/800
(58) Field of Search ........................ 361/752, 816, 361/753, 800, 818

(56) References Cited

U.S. PATENT DOCUMENTS 5,881,453 A * 3/1999 Avery et al. ................... 29/834
5,955,930 A * 9/1999 Anderson et al. ........... 333/109

* cited by examiner

Primary Examiner—Jayprakash N. Gandhi
Assistant Examiner—Thanh Y. Tran

(57) ABSTRACT

A compact structure for a passive microwave device such as combiner/divider having a microstrip line PCB disposed in a housing with connectorized ends. The structure includes a cover screwed down to a bed in the housing around the PCB. The bed is slanted toward the PCB. A periphery portion of the cover is bent by screws according to the slanted bed. This bend causes stress within proportional limit on a stress-strain curve for the cover material, so the cover tends to spring back. By the trend, the cover's outline edge seals the housing against RF leakage. No any gasket is needed. For better compactness of the structure, push-in type connectors are used. The cover overhangs press-in portions of the connectors. The bed has smooth transition from its wider portions at side walls of the housing to more narrow portions at connectorized ends. The cover has rounded corners. Because of this, the bend action spread from sides to ends and no screws at ends needed, that contribute to compactness of the structure. The structure is inexpensive because of absence of a gasket, simple sheet metal structure of the cover and no need in additional labor to install the cover in the housing.

6 Claims, 3 Drawing Sheets

COMPACT MICROWAVE STRUCTURE HAVING REDUCED RF LEAKAGE

BACKGROUND OF THE INVENTION

In compact microwave structures the printed transmission lines are widely used. They are broadband in frequency and generally economical to produce. The most commonly used is a microstrip line. This is a transmission-line geometry with a single conductor trace on one side of a dielectric substrate and a single ground plane on the opposite side. Since it is an open structure, microstrip line has a major fabrication advantage over stripline. It also features ease of interconnections and adjustments.

In a microstrip line, the electromagnetic fields exist partly in the air above the dielectric substrate and partly within the substrate itself. The effective dielectric constant of the line is greater than the dielectric constant of air and less than that of the dielectric substrate. It is apparent that a basic (unshielded) microstrip line is not really a practical structure. It is open to the air and, in reality, it is desirable to have circuits that are covered to protect them from the environment as well as to prevent radiation and electromagnetic interference (EMI). Covering the basic microstrip configuration with a metal housing and a metal plate on the top leads to a shielded microstrip line. In the case of high power applications (which is a current trend), the main purpose of the housing is to provide electromagnetic shielding or, in other words, to prevent RF leakage. The other purposes are to provide mechanical strength, germetization, heat sinking, and to protect the circuitry from moisture, humidity, dust, salt spray, and other environmental contaminants. In order to protect the circuit, certain methods of sealing can be used: conductive epoxy, solder, welding, gasket materials, and metallization tape.

One of the most often used unit incorporated microstrip line printed circuit board (PCB) in microwave applications is a combiner/divider. This unit usually includes a housing having a bottom, two connectorized ends (input-output), two side walls and a cover. In combination with the covered housing the microstrip line is converted into shielded microstrip line. There is a relationship between the effective dielectric constant and physical dimensions of the shielded microstrip line. The side walls should be sufficiently spaced so that only weak fringing fields being seen and, therefore, a negligible effect on the effective dielectric constant being produced. The cover tends to lower the effective dielectric constant and reduce the impedance. The cover enables electric fields in the air above the strip conductor thereby giving the air more influence in determining the propagation characteristics. Only when the ratio of the distance from the cover to the dielectric substrate and the substrate thickness is greater than 10, the cover effects can be considered negligible. In practice, where the overall dimensions of the unit are usually very limited, this ratio is difficult to hold at 10. Designers increase the distance to the cover for the expense of cover's thickness.

There are three types of losses that occur in microstrip lines: conductor losses, dielectric losses, and radiation losses. The latest two contribute to field emissions. Those losses can be minimized, but they can not be totally eliminated. The only protection from RF leakage into environment is covered housing. Usually, the housing is a structure having a bottom, two side walls and two opposite ends with openings to receive connectors. Top of the structure constitutes an aperture. This aperture can be closed by a cover. In order to make the structure more compact (which often is a requirement), the press-in type connectors are used, and the cover is situated as close to the connectors as possible. With minimum size structure, where the cover is thin to a strength limit and there is no room for a gasket in the housing, the most vulnerable place in terms of RF leakage is a cover-housing contact.

Covers for passive microwave structures that are used without any gaskets and provide good contact with the housing are known (see, for example, U.S. Pat. No. 6,044,538). In the known structure the cover periphery having notch with a beveled edge is engaged with a housing aperture periphery having slanted face. The cover dimensions across the cover exceeds the aperture dimensions. The cover can be engaged with the housing by having a temperature differential that is sufficient to permit the cover to be positioned across the aperture. This temperature differential can be created by heating the housing.

Heating the housing of the combiner/divider when PCB and electronic components are already in place is very problematic. Another problem is the notch in the cover. The notch requires additional thickness of the cover material and associated space. Additional machining, equipment, labor and associated expenses are also required.

Accordingly, what is needed is a structure that can provide for the cover maximum proximity to connectors along with reliable shielding against RF field emittance. The cover and the housing should have minimal thickness and provide shielding without use of gaskets. A simple flat structure for the cover is also needed. Compactness of the structure in combination with mechanical strength is also needed.

BRIEF SUMMARY OF THE INVENTION

The present invention relates to a compact passive RF structure, mainly to a combiner/divider comprising a housing having a bottom portion, two side walls and two ends that in combination form a pocket inside the housing. In the housing a microstrip line PCB is disposed. A cover closes the pocket in the housing. There are holes in the ends with push-in type connectors pressed in them. The pocket comprises a bed all around its periphery where the cover is seating. The bed comprises blind threaded holes at side wall areas where it is wider than at end areas. There is no room for threaded holes as well as for a gasket at end areas. The cover overhangs push-in portion of the connectors leaving minimum metal thickness for the housing material that is just enough to withstand stress in the connectors' pressing process. The cover is secured to the housing by screws.

According to the present invention the bed of the housing is slanted toward the pocket with PCB and comprises threaded holes that are perpendicular to the bed surface. The cover that is thin and originally flat is bent along its periphery by force of tightened screws. The cover and the bed have rounded corners. Because of this, the force is spread all around the cover's edge. Stress caused by this bend does not exceed a proportional limit on the stress-strain curve for a given material of the cover that is metal. It means that, when all screws are tightened, the cover still tends to spring back to its original flat shape. As a result, specific force applied to the bed by an edge of the cover is immense because of very small area of the contact between the cover's edge and the bed. Therefore, this spring back action of the cover provides good sealing against RF leakage without use of any gasket.

By definition, a combiner/divider combines several channel into one, or divides one channel into several ones.

Therefore, there are several connectors in one end of the structure and one connector in the other end. According to the present invention the pocket's aperture in the housing and, accordingly, the cover has shape of a funnel with "a spout" facing the end having one connector. For better conveying the spring back action of the cover from screwed sides to the non-screwed ends the cover corners are rounded.

Thus, the structure according to the present invention is a passive RF device such as a combiner/divider having a housing with a pocket and a cover seated on a slanted bed formed all around the pocket. The pocket's aperture and the cover have funnel-like shape with rounded corners. The housing contains a microstrip line PCB disposed in the pocket and push-in type connectors disposed in the ends.

It is an object of the present invention to have a structure with maximum protection against RF leakage.

It is a further object of the present invention to have a structure that is compact and mechanically sound.

It is an advantage of the present invention to have a structure sealed against RF leakage without use of any gasket.

It is another advantage of the present invention to have a structurally simple cover that is flat and does not need any special edge preparation.

It is another advantage of the present invention to have an inexpensive structure that does not need any additional process, such as heating, to install the cover in place, and needs minimum labor for assembly.

DETAILED DESCRIPTION OF THE INVENTION

Figure 1:
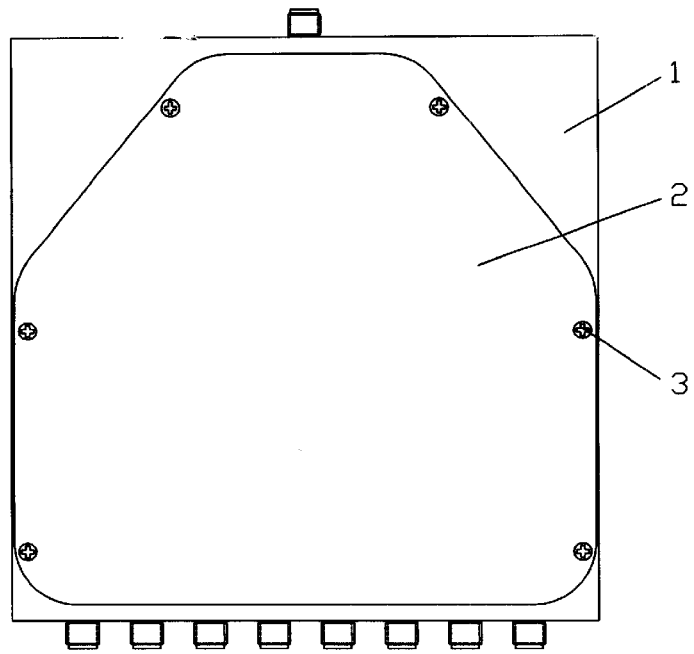
FIG. 1 shows top view of the preferred embodiment of the structure according to the present invention.
Figure 2:
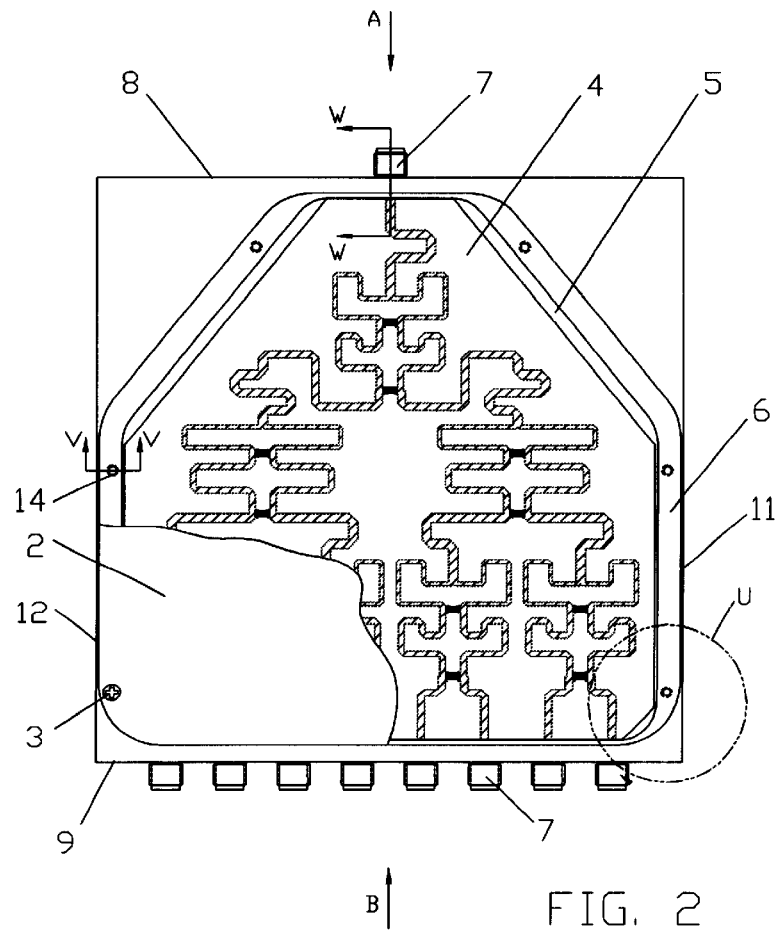
FIG. 2 is the same view as shown on FIG. 1, with cover partially removed.

Referring to FIG. 1 the structure according to the present invention comprises a housing 1 and a cover 2 secured to the housing 1 by plurality of screws 3. Within the housing 1 a microstrip line PCB 4 is disposed in a pocket 5, as shown on FIG. 2. A bed 6 is situated all around aperture of the pocket 5. The cover 2 seats by its periphery portion on the bed 6 and close the pocket 5.

Figure 3:
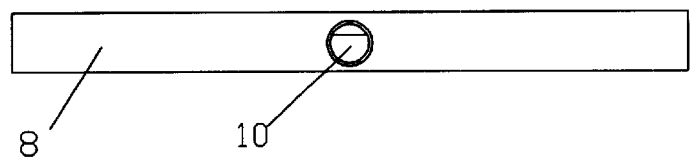
FIG. 3 is view "A" to FIG. 2 with connector removed.
Figure 4:
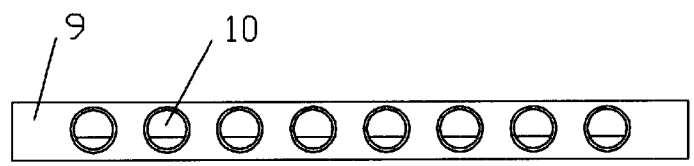
FIG. 4 is view "B" to FIG. 2 with connectors removed.
Figure 5:
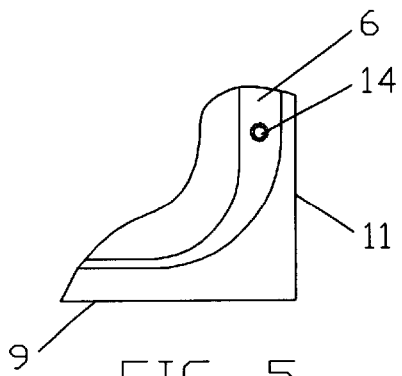
FIG. 5 is enlarged detail "U" to FIG. 2 with cover and PCB removed.

The housing 1 also incorporates plurality of connectors 7 disposed in its opposite ends 8 and 9. For a compact structure the connectors 7 of push-in type (the ones that are pressed into a housing) are usually used. FIG. 3 and FIG. 4 show ends 8, 9 respectfully, with plurality of holes 10 as they prepared to receive connectors 7. Straight lines within holes 10 show bottom of the pocket 5 where PCB 4 seats. The bed 6 has different width: it is relatively wide at side walls 11, 12 of the housing 1 and narrow at ends 8, 9 with smooth transition from wide portion to narrow one, as clearly shown on FIG. 5.

Figure 6:
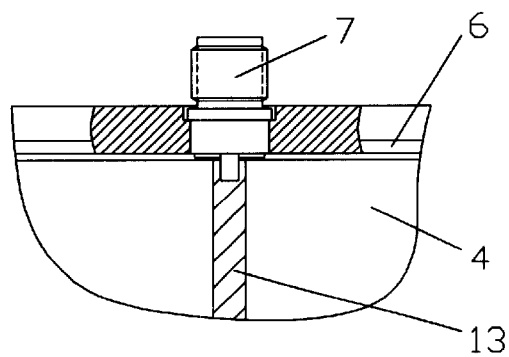
FIG. 6 is W—W section to FIG. 2.

Every connector 7 is pressed into the hole 10 and electrically connected to a microstrip line 13 of the PCB 4. FIG. 6 shows the bed 6 as situated right above a pressed in portion of the connector 7 to provide better compactness to the structure.

Figure 7:
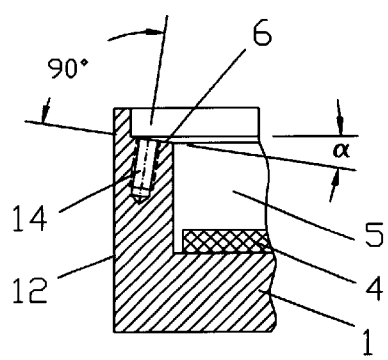
FIG. 7 is V—V section to FIG. 2 with cover removed.
Figure 8:
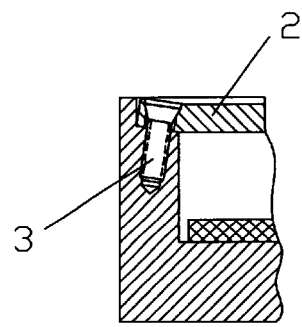
FIG. 8 is V—V section to FIG. 2 with cover in place.
Figure 9:
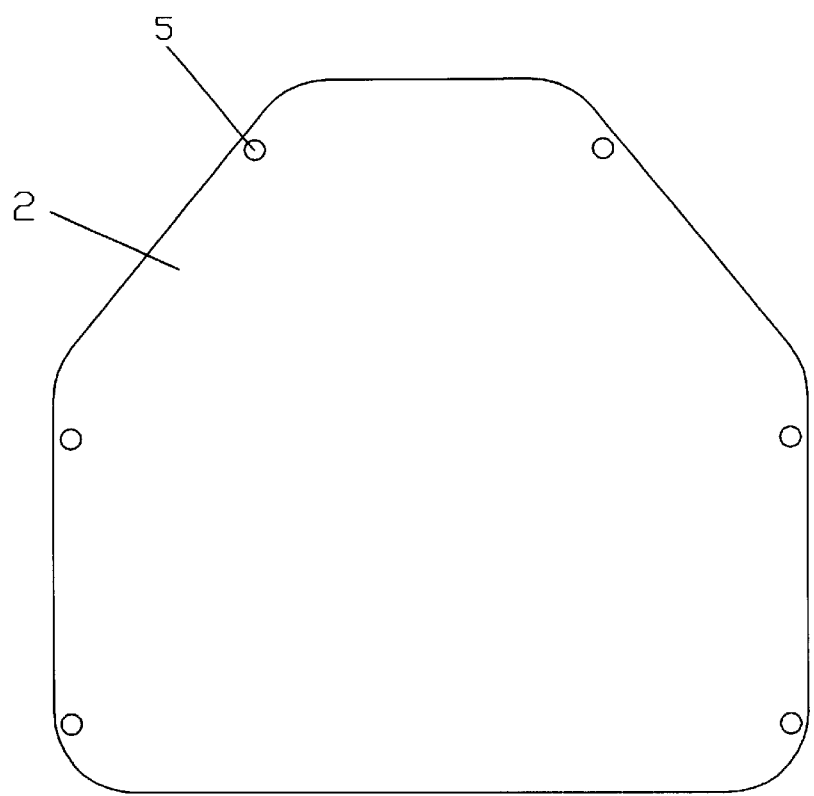
FIG. 9 shows the cover in the same projection as it is shown in assembly with the housing on FIG. 1.

Referring to FIG. 7 and FIG. 8 the bed 6 is slanted with angle a toward and all around the pocket 5. Every tapped hole 14 that receive the screw 3 is situated perpendicular to the bed 6 surface. Cover 2 is secured to the housing 1 by screws 3 that are screwed down into tapped holes 14. Before being mounted to the housing 1, the cover 2 is a flat structure having mounting holes 15 as shown on FIG. 9. All corners of the cover 2 are rounded. When assembled, the cover's edge areas are bent with force applied to it by screws 3. Despite absence of screws at end 8, 9 areas of the housing, the force from screws 3 is transferred to those areas throughout rounded corners of the cover 2. The shorter end areas of a cover the more uniform is force applied all along those areas. Length of those areas should be so small as shape of a PCB is allowed. Therefore, in the case of the described embodiment of the present invention this length at the end 8 having one connector 7 is smaller than that at the end 9 with plurality of the connectors 7.

Figure 10:
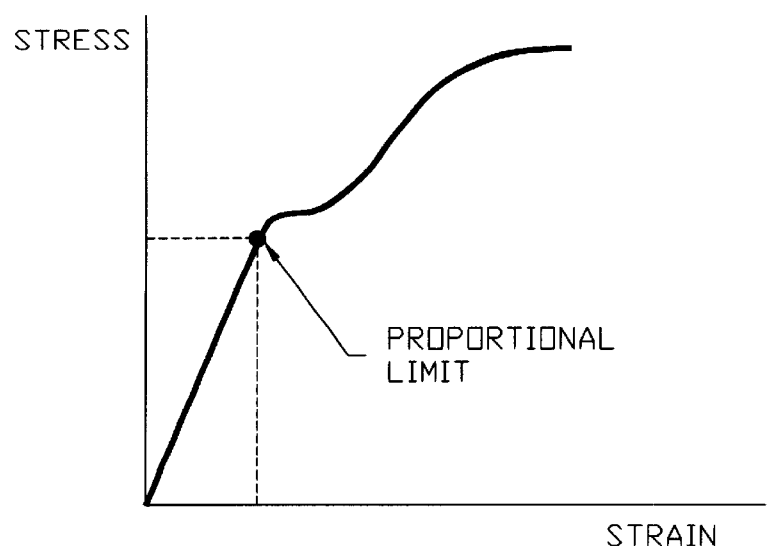
FIG. 10 is a stress-strain curve showing proportional limit up to which a stress in the cover is allowed according to the present invention.

In assembly operation, when flat cover 2 is located in the housing 1 (before being screwed down), it seats on the bed 6 with outline edge only. During tightening the screws 3, because the bed 6 is slanted, the cover 2 starts bending around its outline edge until it makes contact with entire surface of the bed 6. Because the cover 2 is bent within proportional limit of stress on the stress-strain curve for the cover's material that shown on FIG. 10, the outline edge of the cover 2 tends to spring back This spring back trend applies force to the outline edge of the cover 2, which is a very narrow area. Thus, intense specific force is applied all over the outline edge of the cover 2 in addition to the local force applied by the screws 3 and affected only the areas under and near the screw heads.

The intense specific force applied as described above acts the same way as a spring or resilient gasket that equalized the force applied by screws. So, the structure according to the present invention provides a sealing without any need in a gasket. A very thin cover can be used. Connectorized ends can be covered and sealed without any screws at those ends. Without a gasket and screws at ends, a minimum size of the structure can be achieved. Use of a simple flat cover that does not need any additional process for assembly, such as a housing heating, leads to an inexpensive structure.

While the invention having been described in detail, it is clear that there are variations and modifications to this disclosure here and above which will be readily apparent to one of ordinary skill in the art. To the extent that such variations and modifications of the present disclosure of a compact microwave structure with reduced RF leakage having a housing with a slanted bed for an originally flat thin cover being bent by screws when installed in the housing, which result in substantially uniform shielding of a PCB disposed inside the housing by the cover and minimum size of the structure, such are deemed within the scope of the present invention.

I claim:

1. A compact microwave structure having reduced RF leakage, comprising:

a housing having two ends with connectors, two side walls, a pocket with a bed around it, and a printed circuit board disposed in said pocket, wherein said bed having surface slanted toward said pocket and tapped holes situated perpendicularly to said surface of said bed;

a cover having holes and outline edge along periphery portion, wherein said cover is secured to said housing by screws installed throughout said holes in said cover into said tapped holes in said housing, said outline edge having rounded corners and said cover having shape and size to seat on said bed and close said pocket with said periphery portion that is bent by said screws to a stress within a proportional limit on the stress-strain curve for a material said cover is constructed.

2. A structure as recited in claim 1, wherein said connectors are push-in type having pressed-in portion, said tapped holes are located along said side walls of said housing, said bed is more narrow at areas near said end relative to areas near said side walls, and said cover overhangs said pressed-in portion of said connectors.

3. A structure as recited in claim 1, wherein said bed having smooth transition in shape from said narrow areas at said ends of said housing to wider areas at said side walls of said housing.

4. A structure as recited in claim 1, wherein said cover is metal.

5. A structure as recited in claim 1, wherein said printed circuit board of a microstrip line type and is connected to said connectors in said ends of said housing.

6. A structure as recited in claim 1, wherein outlines of said cover, said pocket and said bed having shape of a funnel with "a spout" situated at said end where only one of said connectors is disposed.

* * * * *